(12) United States Patent
Good et al.

(10) Patent No.: US 7,330,800 B1
(45) Date of Patent: Feb. 12, 2008

(54) METHOD AND APPARATUS FOR SELECTING SITES FOR SAMPLING

(75) Inventors: Richard P. Good, Austin, TX (US); James Broc Stirton, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/539,800

(22) Filed: Oct. 9, 2006

(51) Int. Cl.
*G01N 37/00* (2006.01)
(52) U.S. Cl. .................................................. 702/83
(58) Field of Classification Search ............... 702/83
See application file for complete search history.

(56) References Cited

OTHER PUBLICATIONS

Dwayne Pepper, IEEE 1994, Sematech, Guidelines for Statistically Based Sampling Reduction, Austin, Texas, p. 216-220.*

\* cited by examiner

*Primary Examiner*—Tung S. Lau
(74) *Attorney, Agent, or Firm*—Williams, Morgan & Amerson, P.C.

(57) ABSTRACT

A method includes providing a plurality of sampling rules. Each sampling rule is associated with at least one of a plurality of sites on a workpiece. At least one penalty is assigned to each sampling rule. The penalty is assessed responsive to a previous site selection not satisfying the associated sampling rule. A subset of the sites is selected for subsequent metrology based on the sampling rules and the assessed penalties. At least one characteristic of the workpiece is measured at the selected subset of the sites.

24 Claims, 2 Drawing Sheets

METHOD AND APPARATUS FOR SELECTING SITES FOR SAMPLING

CROSS-REFERENCE TO RELATED APPLICATIONS

Not applicable.

STATEMENT REGARDING FEDERALLY SPONSORED RESEARCH OR DEVELOPMENT

Not applicable

BACKGROUND OF THE INVENTION

The present invention relates generally to manufacturing and, more particularly, to a method and apparatus for selecting sites for sampling.

A semiconductor fabrication facility typically includes numerous processing tools used to fabricate semiconductor devices. The processing tools may include photolithography steppers, etch tools, deposition tools, polishing tools, rapid thermal processing tools, ion implantation tools, and the like. Wafers (or wafer lots) are processed in the tools in a predetermined order and each processing tool modifies the wafers according to a particular operating recipe so that a desired product is formed in or on the wafer. For example, a photolithography stepper may be used to form a patterned layer of photoresist above the wafer. Features in the patterned layer of photoresist correspond to a plurality of features (e.g., gate electrode structures) that will ultimately be formed above the surface of the wafer. When processing of the wafer is complete, the various features formed in or on the wafer, as well as features formed in or on layers that are deposited above the wafer, combine to form the desired product. Exemplary products include processors, memory elements, and the like.

The semiconductor fabrication facility typically also includes metrology tools for collecting data indicative of the physical state of one or more wafers before, during, and/or after processing by the processing tools. Collecting the data indicative of the physical state of a wafer using a metrology tool is conventionally referred to as "sampling" the wafer. Data collected by the metrology tools may be used to characterize the wafer, to detect faults associated with the processing, and/or to determine (or predict) the quality of the finished product. For example, a mean critical dimension associated with the various features (e.g., gate electrode structures) may be indicative of a performance level of products formed on the wafer and/or the wafer lot. If the wafer state data indicates that the mean critical dimension associated with the feature (e.g., a gate electrode) is on the lower end of an allowable range for such feature sizes, then this may indicate that the product formed on the wafer may exhibit relatively high performance levels. For example, smaller feature sizes in a processor formed on the wafer may be associated with faster processing speeds. Higher performance products may be sold at a higher price, thereby increasing the profitability of the manufacturing operation.

High-volume semiconductor fabrication facilities may process hundreds or even thousands of wafer lots every week. Sampling every processed wafer (or wafer lot) may significantly reduce the efficiency of the semiconductor fabrication facility, at least in part because metrology generally takes longer than processing. Accordingly, only a portion of the wafers processed in the facility are typically sampled. For example, a wafer lot including 25 wafers may be processed using a three-chamber etching tool. To monitor the operation of each chamber of the etching tool, an engineer may select particular wafers in a run to be sampled by a metrology tool and include these selections in a sampling plan. If the wafers are provided to the chambers of the etching tool sequentially, one possible sampling plan could be to perform metrology on the first wafer, which should be provided to the first chamber, on the 11th wafer, which should be provided to the second chamber, and on the 24th wafer, which should be provided to the third chamber.

Moreover, it is not feasible to sample each die location on a selected wafer. It is known that certain characteristics vary across the wafer due to non-uniform processing. For example, an etch tool or chemical mechanical planarization (CMP) tool may vary radially, such that the process rate is greater nearer the center of the wafer or nearer the periphery of the wafer. Hence, a plurality of sites in different locations on the wafer is selected for sampling. Typically, the locations of these selected sites are fixed. Depending on the degree of oversight required for the product, the number of fixed sites may vary. For instance, 5, 9, or 17 sites may be sampled on a wafer.

Static sampling plans, such as the one described above, are appropriate as long as the manufacturing environment in the semiconductor fabrication facility is also static. With respect to site-level sampling, the predetermined site locations provide a fixed view of wafer uniformity. Uniformity variations in directions not addressed by the predetermined sample sites are not apparent from the collected metrology data.

This section of this document is intended to introduce various aspects of art that may be related to various aspects of the present invention described and/or claimed below. This section provides background information to facilitate a better understanding of the various aspects of the present invention. It should be understood that the statements in this section of this document are to be read in this light, and not as admissions of prior art. The present invention is directed to overcoming, or at least reducing the effects of, one or more of the problems set forth above.

BRIEF SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One aspect of the present invention is seen in a method that includes providing a plurality of sampling rules. Each sampling rule is associated with at least one of a plurality of sites on a workpiece. At least one penalty is assigned to each sampling rule. The penalty is assessed responsive to a previous site selection not satisfying the associated sampling rule. A subset of the sites is selected for subsequent metrology based on the sampling rules and the assessed penalties. At least one characteristic of the workpiece is measured at the selected subset of the sites.

Another aspect of the present invention is seen in a method that includes providing a plurality of sampling rules. Each sampling rule is associated with at least one of a plurality of sites on a semiconductor wafer. At least one penalty is assigned to each sampling rule. The penalty is assessed responsive to a previous site selection associated with a previous metrology event not satisfying the associated sampling rule. A subset of the sites is selected for subsequent metrology based on the sampling rules and the assessed penalties. A sampling plan indicating the selected subset is outputted.

BRIEF DESCRIPTION OF THE SEVERAL VIEWS OF THE DRAWINGS

The invention will hereafter be described with reference to the accompanying drawings, wherein like reference numerals denote like elements, and.

Figure 1:
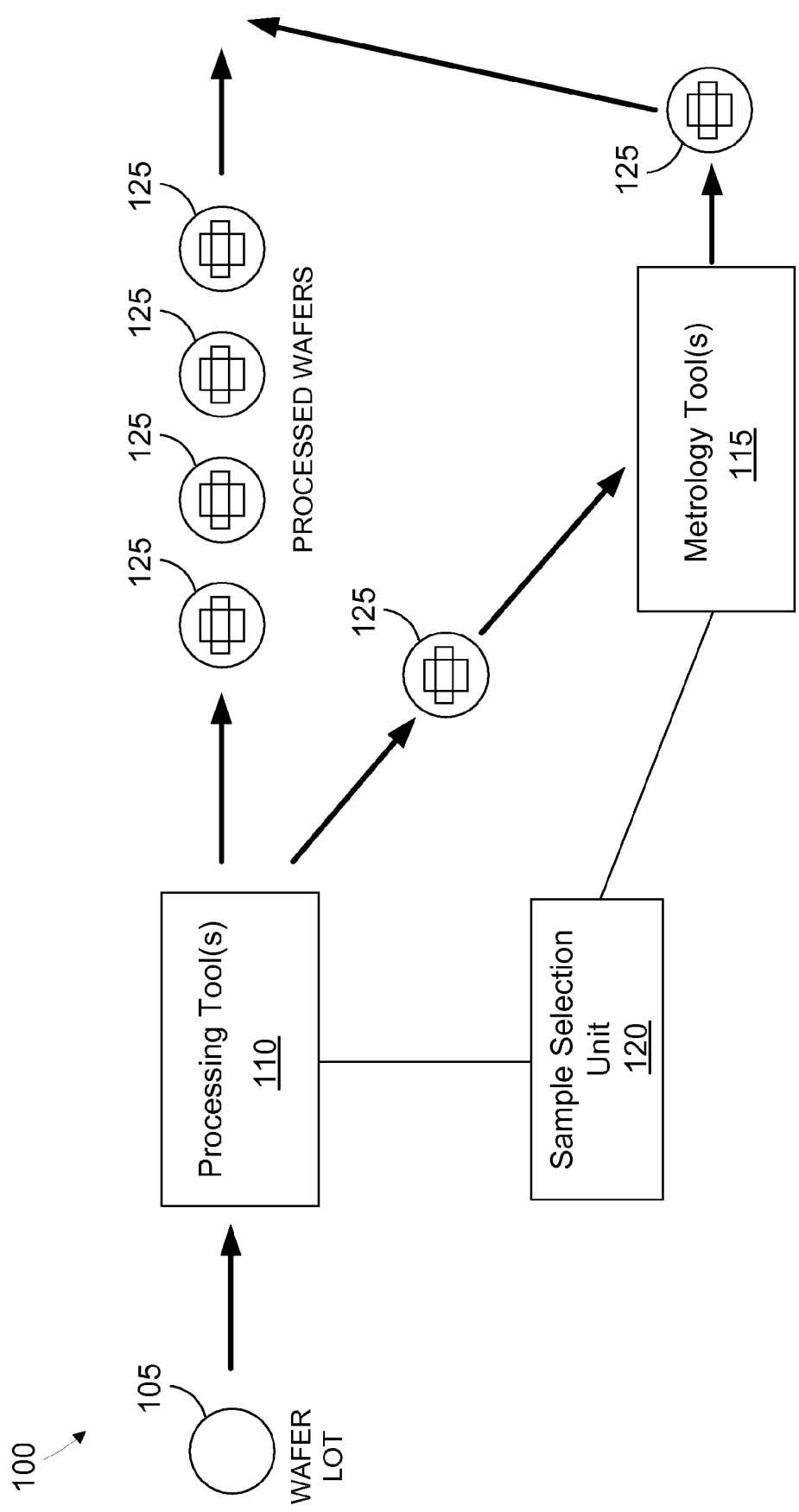
FIG. 1 is a simplified block diagram of an illustrative manufacturing system in accordance with one aspect of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

One or more specific embodiments of the present invention will be described below. It is specifically intended that the present invention not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or "CDROM"), and may be read only or random access. Similarly, the transmission medium may be twisted wire pairs, coaxial cable, optical fiber, or some other suitable transmission medium known to the art. The invention is not limited by these aspects of any given implementation.

Referring now to the drawings wherein like reference numbers correspond to similar components throughout the several views and, specifically, referring to FIG. 1, the present invention shall be described in the context of an illustrative manufacturing system 100. Although the invention is described as it may be implemented in a semiconductor fabrication facility, the invention is not limited to implementation in a semiconductor fabrication facility and may be applied to other manufacturing environments. In the illustrated embodiment, the manufacturing system 100 is configured to fabricate semiconductor devices in or on one or more wafer lots 105. The particular type of semiconductor devices, or products, formed in or on the wafers in the wafer lot 105 are not material to the present invention and, in various alternative embodiments, may include any type of product. In various alternative embodiments, the techniques described herein may be applied to a variety of workpieces or manufactured items to form products including, but not limited to, microprocessors, memory devices, digital signal processors, application specific integrated circuits (ASICs), or other similar devices. The techniques may also be applied to workpieces or manufactured items other than semiconductor devices. Persons of ordinary skill in the art having benefit of the present disclosure should appreciate that, in various embodiments, the wafer lots 105 may represent individual wafers, multiple wafers, one or more wafer lots, or any other number and/or grouping of wafers.

The manufacturing system 100 includes one or more processing tools 110 that may be used to form one or more products, or portions thereof, in or on the wafers in the wafer lots 105. In the illustrated embodiment, the processing tools 110 are depicted as a single entity. However, persons of ordinary skill in the art should appreciate that the processing tools 110 may be implemented in any number of entities. Moreover, in various alternative embodiments, the manufacturing system 100 may include any number of processing tools 110 of any type, including lithography tools, deposition tools, etching tools, polishing tools, annealing tools, and the like. In the illustrated embodiment, the manufacturing system 100 also includes one or more metrology tools 115, which may be integrated or standalone metrology tools 115. For example, the manufacturing system 100 may include metrology tools 115 such as scatterometers, ellipsometers, scanning electron microscopes, and the like. Techniques for operating the processing tools 110 and metrology tools 115 are known in the art and, in the interest of clarity, only those aspects of the operation of these devices that are relevant to the present invention will be discussed further herein.

A sample selection unit 120 is communicatively coupled to the processing tools 110 and the metrology tools 115. In the interest of clarity, the individual connections between the sample selection unit 120 and the processing tools 110, as well as the connections between the sample selection unit 120 and the metrology tools 115, are each depicted using a single line in FIG. 1. However, persons of ordinary skill in the art should appreciate that numerous interconnections may be used to communicatively couple the sample selection unit 120 to the processing tools 110 and/or the metrology tools 115. Persons of ordinary skill in the art are able to configure the manufacturing system 100 to provide the required interconnections to establish a communicative coupling between the sample selection unit 120, the processing tools 110, and the metrology tools 115. In various alternative embodiments, the sample selection unit 120 may be implemented in a computing device such as a desktop computer, a laptop computer, and the like. However, persons of ordinary skill in the art should appreciate that, in alternative embodiments, portions of the sample selection unit 120 may be implemented in any number of devices and/or locations.

In operation, the processing tools 110 process one or more of the wafers in the wafer lot 105 to form one or more processed wafers 125. For example, the processing tools 110 may be used to form one or more features (e.g., a gate electrode) and/or one or more devices (e.g., a microprocessor and/or a memory element) in or on the wafers in the wafer lot 105 to produce the processed wafers 125.

The sample selection unit 120 may select one or more of the processed wafers 125 for sampling by the metrology tools 115. Techniques for selecting particular wafers are described in U.S. patent application Ser. No. 11/239,814, entitled "METHOD AND APPARATUS FOR SELECTING WAFERS FOR SAMPLING," incorporated herein by reference in its entirety. After selecting particular wafers for sampling, the sample selection unit 120 also selects particular sites on the wafer for sampling.

In one embodiment, the sample selection unit 120 selects particular sites based on one or more sampling rules associated with the sampling process. Exemplary sampling rules include, but are not limited to, sampling each potential site, sampling less than or equal to a predetermined number of sites, sampling each site combination to allow collection of site bias data, sampling sites at different radial positions, sampling sites measured in previous metrology events, etc. The sample selection unit 120 may also select one or more of the sites based on a jeopardy state associated with each of the sampling rules. A jeopardy state (or jeopardy count) indicates how many wafers have been processed since the associated sampling rule was satisfied. For example, if 10 wafers have been measured since selecting a particular site, the site would have a jeopardy state of 10 associated with the sampling rule that each site should be measured. In one embodiment, the jeopardy state associated with the sampling rule may be set to one after the metrology is performed on the selected site.

Figure 2:
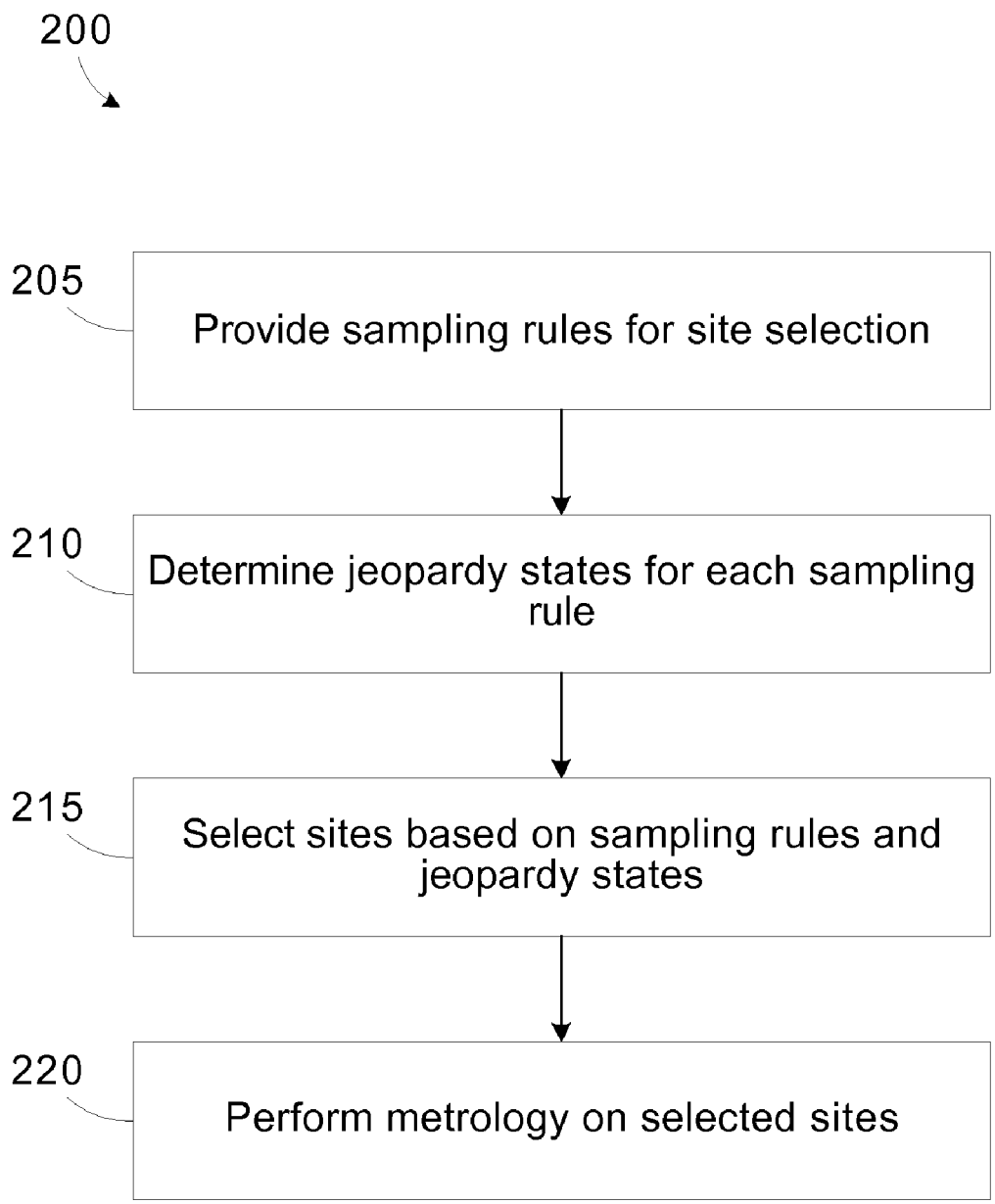
FIG. 2 is a simplified flow diagram of a method for selecting wafer sites for sampling in accordance with another embodiment of the present invention.

FIG. 2 conceptually illustrates one exemplary embodiment of a method 200 of sampling selected wafer sites. In the illustrated embodiment, one or more sampling rules for the site selection process are determined in method block 205. For example, site selection may be constrained to sample at least five sites with a hard sampling rule on sampling seven sites. Sampling may be performed at sites that had already been chosen for previous metrology. For instance, particular sites may be selected for sample wafer electrical tests (SWET). In subsequent final wafer electrical test (FWET) metrology, at least a portion of the SWET sites may be chosen. For example, 3 of 5 SWET sites may be selected. In another example, the previous metrology may be develop inspection critical dimension (DICD) data (i.e., performed after photoresist patterning), and the present metrology may relate to final inspection critical dimension (FICD) (i.e., performed after the feature etch). Sites may be measured at different radial positions to gather data related to within-wafer uniformity. Sampling may be performed on each unique site-site combination. Site combination sampling allows relative biases to be determined amongst the sites, also providing a measure of within-wafer uniformity. For example if nine candidate sites were selected, there are 36 possible site combinations, each having its own sampling rule and associated penalty. Also, all sites may be sampled over time in order based on a jeopardy state associated with each site.

The actual number of candidate sites and the number of sites selected using the hard or soft sampling rules may vary. For example, a wafer may have hundreds of potential sites. The number of candidates sites is selected to provide a varied site group, but not at the expense of reducing the efficiency of the process control. If too many candidate sites are selected, the frequency at which the data is collected for each site decreases, or the metrology load must be increased. In some embodiments, the number of candidate sites may range from 9 to 20.

TABLE 1

Sampling Rules

| Total (soft) (5) | Total (hard) (7) | Previous Metrology (3) | Center (1) | Middle (1) | Edge (1) | Site Comb. (1) | Site (1) |
|---|---|---|---|---|---|---|---|
| 1 | 1 | 1 | 1 | 3 | 5 | 1 | 1 |
| 2 | 2 | 2 | 2 | 4 | 6 | 2 | |
| 3 | 3 | 3 | 7 | 8 | | | |
| 4 | 4 | 4 | | 9 | | | |
| 5 | 5 | 5 | | | | | |

TABLE 1-continued

Sampling Rules

| Total (soft) (5) | Total (hard) (7) | Previous Metrology (3) | Center (1) | Middle (1) | Edge (1) | Site Comb. (1) | Site (1) |
|---|---|---|---|---|---|---|---|
| 6 | 6 | | | | | | |
| 7 | 7 | | | | | | |
| 8 | 8 | | | | | | |
| 9 | 9 | | | | | | |

Table 1 illustrates the exemplary sampling rules for 9 candidate sites. All of the sites are listed in the first and second columns and the soft (5 sites) and hard (7 sites) sampling rules on the total number of selected sites are indicated in the second row. Sites 1-5 are associated with previous metrology and are listed in the third column and the integer (3) in the second row indicates that three or less of these sites should be selected for sampling. The sites residing in the center, middle, and edge regions of the wafer are listed in the forth, fifth, and sixth columns, respectively, and the integers (1) in the second row indicate that one site from each of these groups should be selected for sampling. Each site combination may also be the subject of a separate rule (only one is illustrated). Also, each site is represented by a rule (only one is illustrated).

In method block 210, jeopardy states are determined for each of the sampling rules. In one embodiment, jeopardy states ($x_s$) associated with each of the sampling rules may be listed in one or more additional columns in Table 1. Jeopardy states define cumulative penalties for not satisfying a particular sampling rule. As the penalty increases for a particular rule, the likelihood that sites will be chosen to satisfy the rule increases.

In method block 215, one or more of the sites are selected for sampling based upon the site sampling rules and/or jeopardy states associated with the sampling rules. Various techniques may be used for optimizing the site selection. Exemplary techniques include a brute force technique where all possible site selection combinations are evaluated and the combination having the lowest penalty score is selected. Another technique may involve a next best iterative technique, where the site having the lowest score is selected, after which the scores for remaining sites are recalculated and the next best (i.e., the site having the lowest penalty after recalculation) is selected. Yet another technique involves a mixed integer linear program for solving the optimization. Software packages are publicly available for performing mixed integer linear optimization. For example, the Gnu linear programming kit (GLPK) is a publicly available, open-source software tool that may be used. The particular technique selected depends, at least in part, on the number of candidate sites, as this determines the computational complexity of the algorithm.

One or more of the selected wafers may be provided to one or more metrology tools and metrology may be performed in method block 220 on the selected wafers at the selected sites. Once metrology has been performed on the selected sites, the associated wafers may be returned to the processing flow.

In one embodiment, a matrix formulation to select one or more sites based on one or more sampling rules. The following illustration provides exemplary matrices that may be defined for and employed by a mixed integer linear optimization tool. Penalties and/or rewards associated with selecting the various sites are defined. In one embodiment, penalties may be defined for violating each of the sampling rules, such as the sampling rules shown in Table 1. For example, the penalties, $P_i$, may be defined as:

$$P_i = [5, 50, 6, 3, 3, 3, 5 \ldots, 1 \ldots]^T.$$

Persons of ordinary skill in the art having benefit of the present disclosure should appreciate that the penalties may be defined in a number of ways. The actual values of the penalties may vary; however, the effect of each penalty is determined by its value relative to the other penalties. The values (both absolute and relative) of the penalties are matters of design choice and not intended to limit the present invention.

In the illustrated embodiment, a relatively small penalty (e.g., 5) exists for exceeding the soft sampling limit, while a substantial penalty (e.g., 50) is incurred for exceeding the hard sampling limit. Hence, if additional sites are needed to satisfy other sampling rules, more than 5 sites may be sampled. However, it is unlikely that more than 7 sites would be selected unless the penalties associated with other sampling rules are cumulatively significant. Illustrative penalties for the previous metrology (e.g., 6) and radial region (e.g., 3) sampling rules are also provided. Additional penalties (e.g., 5) not shown may be defined for not selecting each site combination and for not selecting each site (e.g., 1). In the example of nine candidate sites, there would be 36 site combination rules and nine individual site rules.

In some embodiments, two or more types of penalties may be used. For example, one penalty type is to penalize each sampling rule as a whole (P0). For example, if the sampling rules indicate that at most five sites, and seven sites are selected, then an objective penalty function may accrue a penalty of P0 for exceeding the five site limit, regardless of the size of the violation. A second penalty type (P1) is to accrue a penalty for the size of the rule violation. For the above example, the sampling rule is violated by two sites (7 are selected, when only 5 were requested by the sampling rule) so that the penalty accrued by the objective penalty function would be 2×P1. The total penalties may be a combination thereof. In other alternative embodiments, multiple rules can also be combined into a single rule.

Rewards may also be assigned for selecting sites for metrology. For example, the rewards, $R_j$, may be defined as $R_j = \text{diag}(Q_j)X_j$, where Q is a state jeopardy vector and X is a vector that indicates the possible selections. The penalties and/or rewards associated with selecting each site are then summed to determine an overall score. The selection vector, X, having the lowest score represents the optimal site selection.

For example, a class matrix, which includes one or more choices available for each sampling rule, may be defined. For example, the class matrix may include feasible choices for the sampling rules: Every site (Soft), Every site (Hard), Previous Metrology, Radial Position, site Combination, Individual Site, etc. The class matrix, C, for these sampling rules may be written as:

$$C = \begin{bmatrix} 1 & 1 & 1 & 1 & 0 & 0 & 1 & & 1 & \\ 1 & 1 & 1 & 1 & 0 & 0 & 1 & & 0 & \\ 1 & 1 & 1 & 0 & 1 & 0 & 0 & & 0 & \\ 1 & 1 & 1 & 0 & 1 & 0 & 0 & & 0 & \\ 1 & 1 & 1 & 0 & 0 & 1 & 0 & \dots & 0 & \dots \\ 1 & 1 & 1 & 0 & 0 & 1 & 0 & & 0 & \\ 1 & 1 & 0 & 1 & 0 & 0 & 0 & & 0 & \\ 1 & 1 & 0 & 0 & 1 & 0 & 0 & & 0 & \\ 1 & 1 & 0 & 0 & 1 & 0 & 0 & & 0 & \end{bmatrix}$$

Each column of the class matrix represents one of the sampling rules, and the elements having values of "1" represent the sites associated with the rule (i.e., see Table 1).

A matrix may also be defined to indicate relational operators associated with each of the sampling rules. For example, a relational operator matrix, $\psi$, may be defined as:

$$\Psi = [-1, -1, -1, 1, 1, 1, 1 \dots, 1 \dots]^T.$$

Values of $\psi_i = 1$ indicate that the relational operator associated with a sampling rule is greater than or equal to the sampling rule and values of $\psi_i = -1$ indicate that the relational operator associated with that sampling rule is less than or equal to the sampling rule. For example, a value of $\psi_1 = -1$ indicates that 5 or less sites should be selected (soft rule), and a value of $\psi_2 = -1$ indicates that 7 or less sites should be selected (hard rule). A value of $\psi_3 = -1$ indicates that 3 or less sites that were included in the previous metrology event should be selected. Values of $\psi_4 = 1$, $\psi_5 = 1$, and $\psi_6 = 1$ indicate that one or more sites in each of the center, middle, and edge radial regions should be selected, if possible. A values of $\psi_7 = 1$ indicate that one or more site combination should be selected, and a value of $\psi_8 = 1$ indicates one or more site should be selected, if possible.

State jeopardy reward vectors may also be defined. For example, if all sites are considered equal, then a state jeopardy reward vector, Q, may be defined as:

$$Q = [1,1,1,1,1,1,1,1,1]^T.$$

The possible measurement choices may be included in a vector, X, defined as:

$$X = [0, 1, \dots, 1, 0]^T$$

and the number of site selections associated with each sampling rule may be defined in a vector, N:

$$N = [5, 7, 3, 1, 1, 1, 1, \dots, 1, \dots]^T.$$

In this example, the site selection vector, N, indicates that 5 or less sites should be selected (soft rule), 7 or less sites should be selected (hard rule), 3 or less sites that were included in the previous metrology event should be selected, one or more sites in each of the center, middle, and edge radial regions should be selected, 1 or more site combination should be selected, and 1 or more site should be selected.

A violation matrix may be defined using the penalty and/or reward vectors described above. In one embodiment, the violation matrix, V, is defined so that a sampling rule violation is indicated by a value of $V_j < 0$, i.e., a negative value of an element of the violation matrix. For example, the violation matrix, V, may be defined as:

$$V = \text{diag}(\Psi)(C^T X - N).$$

The size of a sampling rule violation may be measured using the value, SV, which is defined as:

$$SV = \frac{V - |V|}{2}.$$

For example, the size of the violation on the soft sampling rule would be equal to 1 if 6 sites are selected for sampling.

A state penalty may also be defined. In one embodiment, the state penalty, J, is defined as:

$$J = C \text{diag}(P) \frac{V - |V|}{2} - (1_{n \times 1} - X) Q x_s,$$

and the total state penalty may be defined as the sum of all of the state penalties associated with each of the n sites:

$$J = \sum_{i=1}^{n} J_i = J^T 1_{n \times 1}.$$

Embodiments of the techniques described above for dynamically selecting wafer sites for metrology may have a number of advantages over conventional static sampling plans. For example, the total number of distinct sites measured over time will increase, which results in improved within-wafer uniformity visibility. Moreover, fewer sites on any given wafer need to be measured, resulting in a decreased metrology load that frees metrology capacity to allow the completion of other metrology tasks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. A method, comprising:
   providing a plurality of sampling rules, each sampling rule being associated with at least one of a plurality of sites on a workpiece;
   assigning at least one penalty to each sampling rule;
   assessing the penalty responsive to a previous site selection not satisfying the associated sampling rule;
   selecting for subsequent metrology a subset of the sites based on the sampling rules and the assessed penalties; and
   measuring at least one characteristic of the workpiece at the selected subset of the sites to generate metrology data representative of the at least one characteristic of the workpiece.

2. The method of claim 1, further comprising:
   determining jeopardy states associated with each of the sampling rules; and
   selecting the subset based on the sampling rules, the assessed penalties, and the jeopardy states.

3. The method of claim 1, wherein assigning said at least one penalty comprises assigning at least one penalty based on a size of a sampling rule violation.

4. The method of claim 1, wherein selecting the subset comprises assigning a reward associated with selecting each site.

5. The method of claim 1, wherein selecting the subset comprises selecting the subset based upon at least one penalty associated with selecting the at least one site and at least one reward associated with selecting the subset.

6. The method of claim 1, further comprising:
defining a class matrix associated with each of the sampling rules;
defining a penalty matrix associated with each of the sampling rules;
defining a violation matrix based on the class matrix and the penalty matrix, the penalty matrix providing a penalty associated with choosing a particular subset of the sites; and
selecting the subset of the sites to optimize a value of the penalty associated with the selection.

7. The method of claim 6, wherein selecting the subset of the sites to optimize the value of the penalty associated with the selection further comprises:
generating a plurality of candidate site selection vectors, each candidate site selection vector comprising a unique subset of the sites;
determining a penalty associated with each of the candidate site selection vectors; and
selecting the candidate site selection vector having a minimum penalty value.

8. The method of claim 1, wherein the plurality of sampling rules includes a rule specifying a maximum number of sites.

9. The method of claim 1, wherein the plurality of sampling rules includes at least one rule specifying the selection of unique site combinations of the plurality of sites.

10. The method of claim 1, wherein the plurality of sampling rules includes at least one rule specifying the selection of sites at differing regions on the workpiece.

11. The method of claim 1, wherein the plurality of sampling rules includes a rule specifying the selection of sites associated with previous metrology performed on the workpiece.

12. The method of claim 1, wherein the workpiece comprises a semiconductor wafer.

13. The method of claim 1, further comprising fabricating subsequent workpieces using a process controlled at least in part based on the measured characteristic.

14. The method of claim 3, further comprising comprises forming a penalty vector based on the assigned penalties.

15. The method of claim 4, wherein assigning the reward associated with selecting each site comprises assigning the reward based on a jeopardy state associated with the site.

16. The method of claim 4, further comprising forming a reward vector based upon the reward associated with selecting each site.

17. The method of claim 5, wherein selecting the subset comprises selecting the subset based upon an iterative calculation of a sum of the at least one penalty associated and the at least one reward, the iterative calculation being taken over the plurality of sites.

18. The method of claim 6, wherein selecting the subset of the sites further comprises:
defining a state penalty matrix providing a state penalty associated with each of the sites as a function of the violation matrix;
summing the state penalties for each of the sites; and
selecting a subset of the sites to optimize a value of the summed state penalties.

19. The method of claim 6, wherein selecting the subset of the sites to optimize the value of the penalty associated with the selection further comprises employing a mixed integer linear optimization.

20. The method of claim 6, wherein selecting the subset of the sites to optimize the value of the penalty associated with the selection further comprises employing a next best optimization technique to iteratively select sites in the subset.

21. A method, comprising:
providing a plurality of sampling rules, each sampling rule being associated with at least one of a plurality of sites on a semiconductor wafer;
assigning at least one penalty to each sampling rule;
assessing the penalty responsive to a previous site selection associated with a previous metrology event not satisfying the associated sampling rule;
selecting for subsequent metrology a subset of the sites based on the sampling rules and the assessed penalties; and
outputting a sampling plan for collecting metrology data representative of at least one characteristic of the semiconductor wafer, the sampling plan indicating the selected subset.

22. The method of claim 21, further comprising measuring at least one characteristic of the wafer at the selected subset of the sites.

23. The method of claim 22, further comprising fabricating subsequent wafers using a process controlled at least in part based on the measured characteristic.

24. A system, comprising:
means for providing a plurality of sampling rules, each sampling rule being associated with at least one of a plurality of sites on a semiconductor wafer;
means for assigning at least one penalty to each sampling rule;
means for assessing the penalty responsive to a previous site selection associated with a previous metrology event not satisfying the associated sampling rule;
means for selecting for subsequent metrology a subset of the sites based on the sampling rules and the assessed penalties; and
means for outputting a sampling plan for collecting metrology data representative of at least one characteristic of the semiconductor wafer, the sampling plan indicating the selected subset.

* * * * *